United States Patent [19]

Nash et al.

[11] 4,061,885
[45] Dec. 6, 1977

[54] DIGITAL TONE DECODER

[75] Inventors: Harold Garth Nash, Tempe; Jack Whitmore, Phoenix, both of Ariz.

[73] Assignee: Motorola, Inc., Chicago, Ill.

[21] Appl. No.: 641,453

[22] Filed: Dec. 17, 1975

[51] Int. Cl.² .......................................... H04M 1/50
[52] U.S. Cl. .................................................. 179/84 VF
[58] Field of Search ................... 179/84 VF; 307/261; 328/28, 138, 137; 324/78 D, 77 R; 307/235 E

[56] References Cited

U.S. PATENT DOCUMENTS

| | | | |
|---|---|---|---|
| 3,537,001 | 10/1970 | Friend | 179/84 VF |
| 3,559,080 | 1/1971 | Kobori | 307/235 E |
| 3,727,079 | 4/1973 | Garrett | 307/235 E |
| 3,760,269 | 9/1973 | Beeman | 324/78 D |
| 3,790,720 | 2/1974 | Schartmann | 179/84 VF |
| 3,935,395 | 1/1976 | Ball | 179/84 VF |
| 3,949,177 | 4/1976 | Ball | 179/84 VF |

FOREIGN PATENT DOCUMENTS

| | | | |
|---|---|---|---|
| 2,157,559 | 11/1971 | Germany | 179/84 VF |
| 1,804,267 | 10/1968 | Germany | 179/84 VF |
| 2,145,955 | 9/1971 | Germany | 179/84 VF |
| 1,164,386 | 5/1967 | United Kingdom | 179/84 VF |

*Primary Examiner*—William C. Cooper
*Assistant Examiner*—Joseph A. Popek
*Attorney, Agent, or Firm*—Anthony J. Sarli, Jr.; Kenneth R. Stevens

[57] ABSTRACT

A digital tone decoder includes means for generating a timing signal, zero crossing counter means for generating a decode signal after a predetermined number of zero crossings in response to an incoming time domain signal and for generating a reset signal at a predetermined time after the decode signal is sent to reset said zero crossing counter means to zero, and decoder means coupled to said zero crossing counter and to said timing means for generating an output signal at one of a plurality of output terminals corresponding to the frequency of the incoming signal upon receipt of the decode signal from said zero crossing counter means, said decoder means being reset to an initial state upon receipt of the reset signal.

10 Claims, 6 Drawing Figures

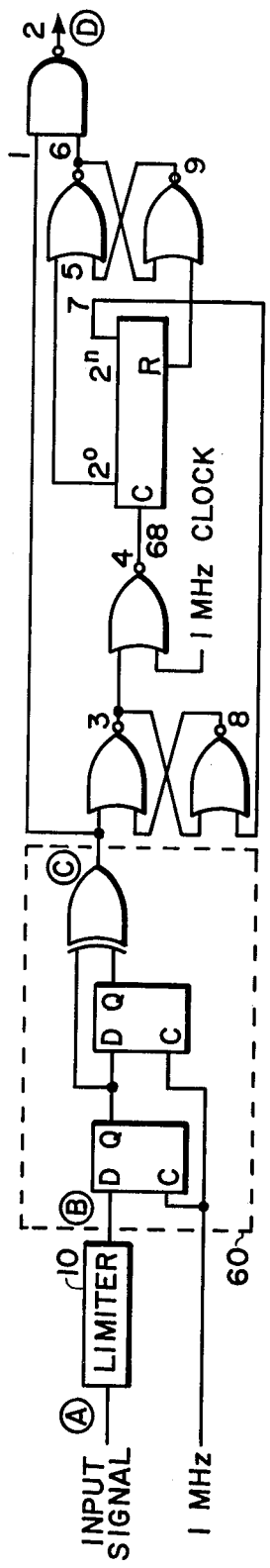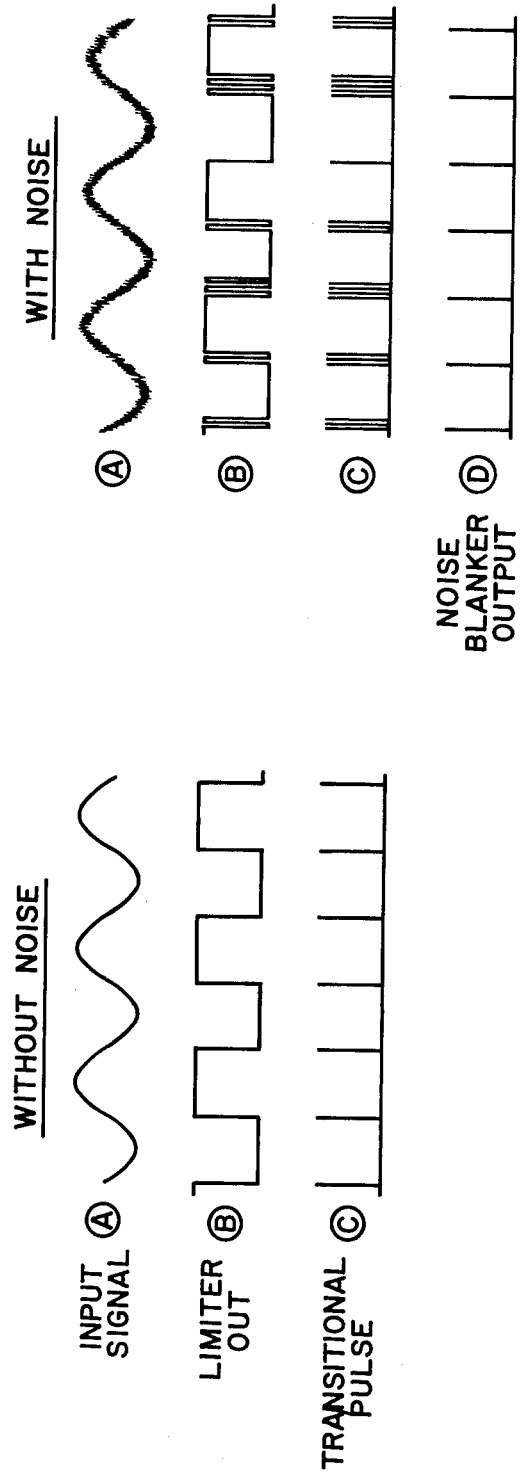
FIG. 3a
FIG. 3b
FIG. 3c

DIGITAL TONE DECODER

BACKGROUND OF THE INVENTION

This invention relates to tone decoders, and more particularly, to digital tone decoders which are capable of detecting the presence of one out of several possible frequencies in close proximity.

Some prior art tone decoders utilize linear tuned circuits centered about each desired frequency. The center frequency accuracy of each linear tuned circuit was required to be ±0.5% so that circuit stability and the ease of making initial adjustments were critical design parameters. This type of apparatus required periodic calibration and costly components. Another type of prior art tone decoder employing phase locked loop techniques was also used in certain applications, but the attack time was too long for satisfactory use in a high speed telephone dialing environment.

Prior art tone decoders also require additional circuitry to provide the ability to reliably detect the presence of a valid signal. Some prior art devices utilize a simple threshold comparator. If any energy, signal or noise, exceeded the predetermined threshold of the comparator, an indication of a valid signal was given. This technique can produce a false indication when only high level noise energy is present. Some other prior art devices determine the presence of valid input signal by comparing the energy in a narrow bandwidth around the expected signal frequency with the energy present across the total bandwidth of the device. The theory of operation here is that ambient noise energy has its spectral energy distributed over the entire channel, while a valid input signal would have its spectral energy distributed within a narrow bandwidth. When a valid signal was present the energy in a narrow bandwidth dominated the ambient noise energy present over the entire channel. When only noise was being received the energy in the wide bandwidth dominated. The disadvantage of using this technique is that it requires an additional bandpass filter and a detector.

SUMMARY OF THE INVENTION

It is an object of this invention to provide a digital tone decoder which requires no initial adjustment and no periodic calibration.

It is another object of this invention to provide a digital tone decoder capable of using a crystal oscillator to generate a clock signal such that a frequency accuracy of ±.05% can be obtained.

It is a still further object of this invention to provide a digital tone decoder which can be implemented using digital MOS LSI techniquies to reduce circuit size, component count, and manufacturing costs.

It is still another object of this invention to provide a digital tone decoder which is compatible with automatic factory computer testing devices.

Briefly stated, and in accord with one embodiment of the invention, a digital tone decoder is provided for generating a frequency domain output signal in response to an incoming time domain signal. The digital tone decoder includes means for generating a timing signal. A zero crossing counter means generates a decode signal after a predetermined number of zero crossings in response to an incoming time domain signal and generates a reset signal at a predetermined time after the decode signal is sent to reset the zero crossing counter means to zero. A decoder means is coupled to the zero crossing counter and to the timing means to generate an output signal at one of a plurality of output terminals corresponding to the frequency of the incoming signal upon receipt of the decode signal from the zero crossing counter means. The decoder means is reset to an initial state upon receipt of the reset signal.

BRIEF DESCRIPTION OF THE DRAWINGS

The invention is pointed out with particularlity in the appended claims, however, other objects and advantages, together with the operation of the invention, may be better understood by reference to the following detailed description taken in connection with the following illustrations wherein:

FIG. 3, comprised of 3a-3c, shows a noise blanker circuit for use with the basic digital tone decoder.

DETAILED DESCRIPTION OF THE INVENTION

In order to better illustrate the advantages of the invention and its contribution to the art, a preferred hardware embodiment of the invention will now be described in some detail.

Figure 1:
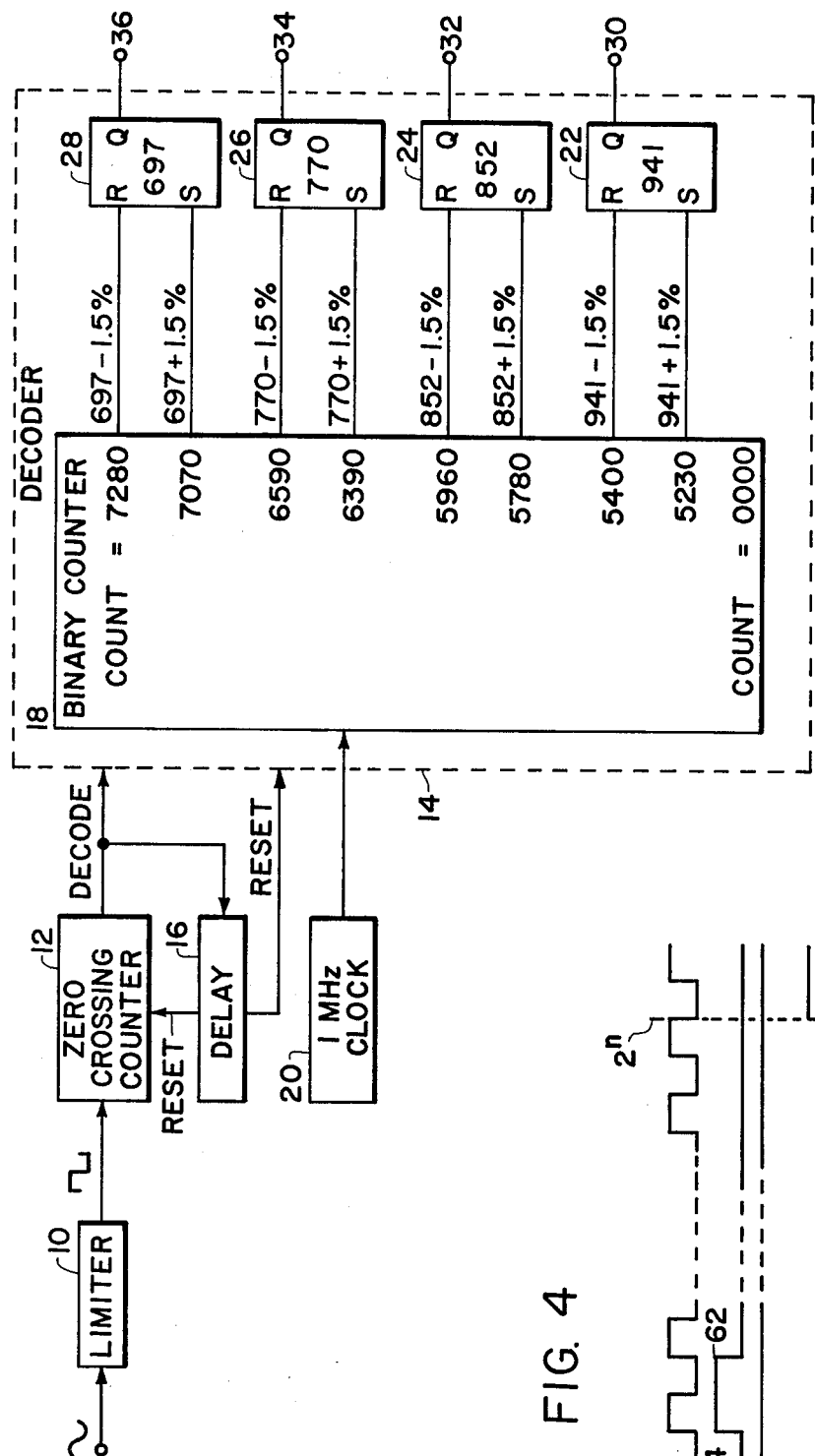
FIG. 1 is a generalized block diagram of the basic digital tone decoder circuit.

The digital tone decoder in accordance with the invention, as illustrated in FIG. 1, includes a limiter 10 which accepts and limits an incoming sinusoidal signal. The resulting square wave output from limiter 10 is coupled to a zero crossing counter 12. After the zero crossing counter 12 has detected a predetermined number of zero crossings, it generates a decode signal. The decode signal is coupled to a decoder 14 and to a delay circuit 16. After a predetermined time delay, delay circuit 16 transmits a reset signal to zero crossing counter 12 and to decoder 14. The primary element of decoder 14 is a binary counter 18. The binary counter 18 is clocked by a one megahertz clock 20. The decoder 14 further includes a set of data latches 22, 24, 26 and 28. Each of the data latches 22, 24, 26 and 28 has a pair of inputs which is coupled to a corresponding pair of outputs from the binary counter 18. One of each pair of outputs from binary counter 18 controls the reset function of each data latch while the other of each pair of outputs from the binary counter 18 controls the set input of each data latch. The outputs of the digital tone decoder are obtained at output conductors 30, 32, 34 and 36 which are connected respectively to the output of data latches 22, 24, 26 and 28.

FIG. 1 illustrates the basic operation of the digital tone decoder. An incoming signal containing a single frequency sinusoidal signal is converted into a square wave by limiter 10. Zero crossing counter 12 and decoder 14 have just been reset to zero. Resetting decoder 14 to zero causes binary counter 18 and the contents of data latches 22, 24, 26 and 28 to be reset to zero. Binary counter 18 is clocked at a one megahertz rate by clock 20. Zero crossing counter 12 begins counting the zero crossings of the square wave input signal and continues counting up to a predetermined number N. When zero crossing counter 12 reaches the Nth count it generates a decode signal which is coupled to decoder 14 and to delay circuit 16. At this instant in time, since there are two zero crossing per cycle of input signal, binary counter 18 has sequenced to the binary count of $[N/2fx] \times 10^6$, where $fx$ represents the frequency of the unknown incoming signal and $10^6$ represents the frequency of the clock signal in hertz. Evaluation of the signal levels at output conductors 30, 32, 34 and 36 just prior to transmission of the reset signal will determine the frequency of the unknown incoming signal. The decode signal from zero crossing counter 12 causes the binary counter 18 to maintain the count it contained at the time the decode signal was received. The delay circuit 16 begins timing when the decode signal is received and after a predetermined delay transmits a reset signal to zero crossing counter 12 and to decoder 14. This delay is introduced into the circuit to provide time for detecting and processing the output signal from the digital tone decoder.

Touch-Tone telephone frequencies are grouped into a high band and a low band of four frequencies each. A separate digital tone decoder circuit is used for each group of frequencies. Thus two decoder circuits, one for the high band group and one for the low band group are required to detect all eight tone frequencies. Normally one frequency from each group is detected to form a tone pair; a tone pair would be "anded" together to designate one of sixteen possible digits. The delay created by delay circuit 16 is preset. The delay created by delay circuit 16 is present to allow information present in both the zero crossing counter 12 and the binary counter 18 to be stored before being reset to start another detection sequence.

The digital tone decoder is capable of detecting any one of four possible incoming signal frequencies. The time required for zero crossing counter 12 to count N zero crossings is defined by the equation: $t = [N/2fx] \times 10^6$. Since binary counter 18 is clocked at a one megahertz frequency each count requires one microsecond.

If the incoming signal contains a frequency of 941 hertz $\pm 1.5\%$, and if $N=6$, the above equation tells us that it will require from 5230 to 5400 microseconds for zero crossing counter 12 to count 6 zero crossings. Counter states between 5230 and 5400 of binary counter 18 constitute a window in which an incoming frequency of 941 hertz $\pm 1.5\%$ can be detected.

Following receipt of a reset signal, both zero crossing counter 12 and binary counter 18 will begin counting from zero at the same time. Zero crossing counter 12 begins counting up to a maximum count of 6 zero crossings. At the same time binary counter 18 is counting up from zero at a one megahertz rate. When binary counter 18 reaches a count of 5230 it generates an output which sets data latch 22. If binary counter 18 continues counting beyond a count of 5400, data latch 22 is reset. If zero crossing counter 12 reaches a count of 6 when binary counter 18 is at a count of 5300, a decode signal will be produced by zero crossing counter 12 which will freeze binary counter 18. For a count of 5300 data latch 22 will have been set, but not reset. Therefore, during the decode interval there will be a high level signal at output conductor 30 and a low level signal at output conductors 32, 34 and 36. This set of conditions indicates the presence of a frequency of 941 hertz $\pm 1.5\%$. At the end of the delay interval determined by delay circuit 16 a reset signal will be generated which will reset zero crossing counter 12, binary counter 18, and all of the data latches 22, 24, 26 and 28.

Each frequency window is defined by an adjacent pair of outputs from binary counter 18. Each data latch also represents a frequency window. The effective bandwidth of each window is determined by the location of the output points on binary counter 18. To obtain a narrower bandwidth for each frequency the number of counts lying between output points is reduced. Any number of windows may be established by merely adjusting the number of output pairs from binary counter 18.

The bandwidth of each window is controlled by the binary counter 18. The tolerance of the cutoff points for each frequency is directly related to the width of the windows. If extremely high tolerances are desired the window can be narrowed. If lesser accuracy is acceptable the windows may be widened. An additional advantage of using a digital tone decoder is that no initial adjustment is necessary at the factory and additionally due to the long term stability of crystal oscillators, periodic calibration is not required. With a digital method of detection the decoder will not be sensitive to changes in environmental conditions. The accuracy and repeatability of the detection scheme embodied in this digital tone decoder is exact from circuit to circuit without resorting to high tolerance components or to hand tuning.

Figure 2:
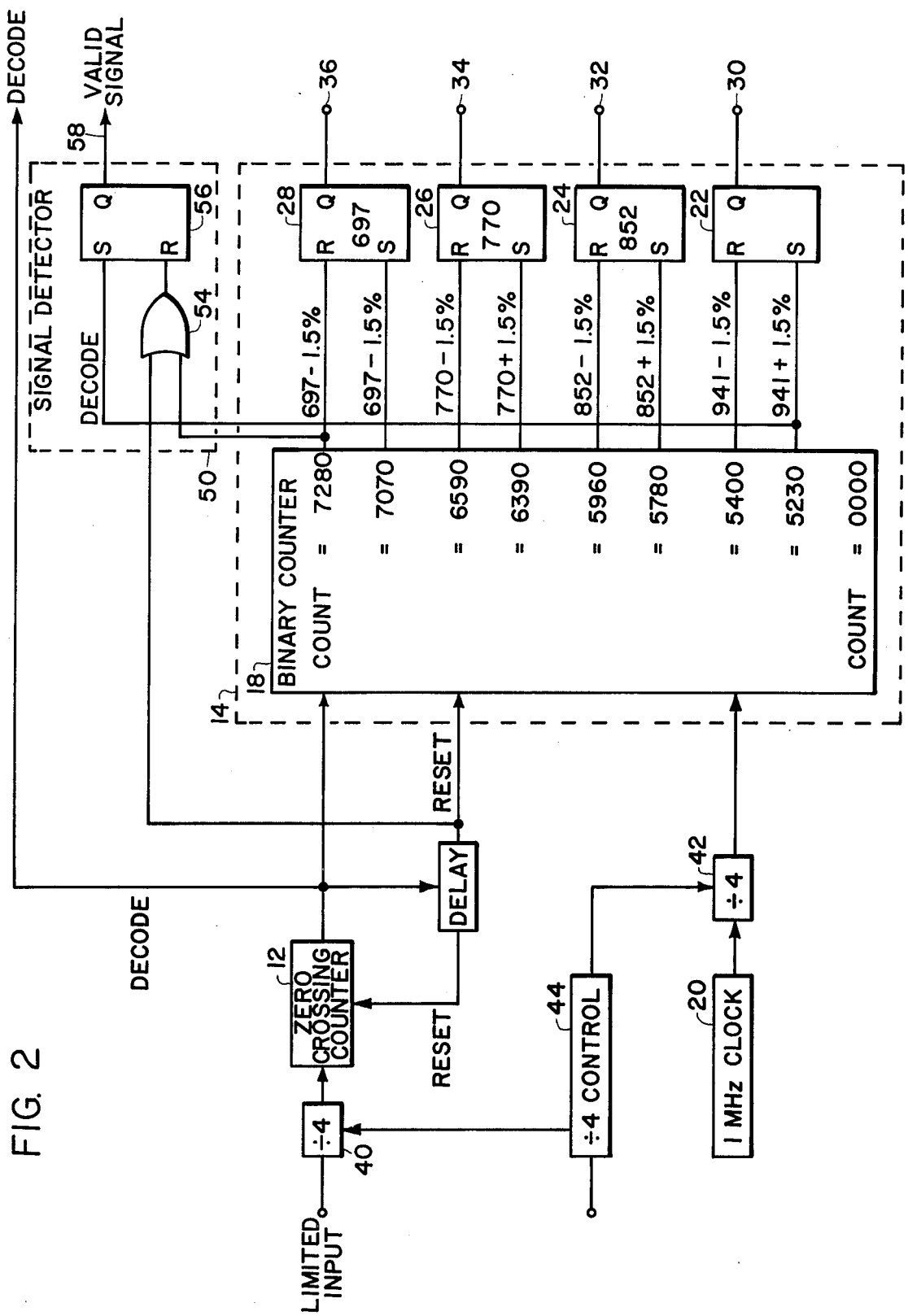
FIG. 2 is a generalized block diagram showing the addition of a valid signal detector circuit and a programmable bandwidth feature for the basic digital tone decoder circuit.

FIG. 2 shows the addition of a programmable bandwidth feature to the digital tone decoder. This programmable bandwidth feature allows through digital methods a means of obtaining the optimal response time versus selectivity in the digital tone decoder.

The digital tone decoder is expected to operate in several types of signal environments. One extreme condition is a relatively high signal to noise ratio (20db) with a short signal duration (20 milliseconds), while the other extreme condition is a degraded signal to noise ratio (12db) with a longer signal duration (80 milliseconds). Consequently, the optimum signal processing time for the digital tone decoder is different for these two conditions. The programmable bandwidth feature provides a digital method to simultaneously program the processing time and the location of each of the frequency windows such that they are optimized for each of the above mentioned environments.

The processing time required to accurately detect an incoming signal containing a short duration pulse in a high signal to noise ratio environment is shorter than the processing time required to detect an incoming signal containing a longer duration signal in a degraded signal to noise ratio environment. The digital tone decoder is optimally designed to deteremine the frequency of an incoming signal within 20 milliseconds. To increase the processing time required for the digital tone decoder to generate an output signal, a divide by four counter 40 is introduced between limiter 10 and zero crossing counter 12. Another divide by four counter 42 is introduced between the one megahertz clock 20 and the binary counter 18. These two divide by four counters are controlled by a divide by four control circuit 44. Divide by four control circuit 44 switches divide by four counters 40 and 42 out of the circuit whenever 20 millisecond pulses are to be processed and switches divide by four counters 40 and 42 into the circuit whenever 80 millisecond pulses are to be processed. When divide by four counter 40 is switched into the circuit it generates only one zero crossing for every four zero crossings it receives. This causes zero crossing counter 12 to operate at one fourth the normal rate and effectively requires the receipt of 24 zero crossings before a decode signal is generated.

When divide by four counter 42 is switched into the circuit the one megahertz clock signal is divided down into a 250 kilohertz clock signal. This slower clock input signal causes binary counter 18 to operate at one fourth the rate at which it previously operated. The digital tone decoder operates in exactly the same it did when the divide by four counters 40 and 42 were switched out of the circuit except that since the number of zero crossings actually counted by the zero crossing counter 12 is modified, and the counting rate of the binary counter 18 is modified, it now takes four times as much time to generate an output signal. The effective decode points for the data latches remain the same for each received frequency.

FIG. 2 also shows the addition of a valid signal detector feature. The valid signal detector 50 is composed of an OR gate 54 and a flip-flop 56.

The operation of the valid signal detector 50 shown in FIG. 2 will be described for a variety of input signal conditions. With an input of no signal and noise energy below a detectable level such that limiter 10 is not generating an output, the binary counter 18 advances normally but the zero crossing counter 12 holds at the reset point since there are no zero crossings for it to detect. Initially, the valid signal output 58 is in the reset mode and is at a low level. As the binary counter 18 advances to a count of 5230 the 5230 output of data latch 22 is energized and sets the signal detector flip-flop 56, indicating the possibility that a valid signal will be received. Since the zero crossing counter 12 is not advancing, no decode signal will be present and binary counter 18 will continue to count until a maximum count of 7280 is reached. When the 7280 output conductor is energized this output signal is coupled to OR gate 54 and then to the reset input of signal detector flip-flop 56 which resets the flip-flop and causes the valid signal output 58 to return to a low level. Binary counter 18 also resets itself to zero and begins the counting cycle over again.

A second input condition indicating the presence of an invalid signal occurs if there is a high ambient noise level at the input. This high ambient noise level input signal produces many zero crossings of the limited input. As the counting sequence begins, the zero crossing counter 12 and the binary counter 18 have been reset. The zero crossing counter 12 reaches its maximum count of 6 before the binary counter 18 can advance to its first output count of 5230. Therefore, when zero crossing counter 12 generates a decode signal, the 5230 output from binary counter 18 will not have set the signal detector flip-flop 56 and a low level output will be present at the valid signal output conductor 58.

The output of the digital tone encoder which is generated at output conductors 30, 32, 34 and 36 is only evaluated by a detector circuit whenever there is a decode signal present on the decode line and a high level valid signal output on the valid signal output conductor 58. Under all other conditions any possible output on output conductors 30, 32, 34 or 36 will be disregarded by the detector circuitry.

When a valid signal is received the zero crossing counter 12 and the binary counter 18 again start from a reset position. The binary counter 18 reaches a count of 5230 which sets the signal detector flip-flop 56 and produces a valid signal output conductor 58. Before the count of 7280 is reached the zero crossing counter 12 reaches a count of 6 and generates a decode signal which freezes the operation of binary counter 18 temporarily. At this time a decode output is present, a high level valid signal output is present at output conductor 58 and a single output is present at one of the output conductors 30, 32, 34 or 36 indicating the presence of a single valid input frequency.

When a valid signal is received together with a periodic high level noise signal, it is possible that the zero crossing counter 12 will reach a count of 6 and generate a decode signal while the binary counter 18 is at a count between windows. As an example, this condition might produce a count of 6700. Under this condition when the decode signal is produced, there will be a high level valid signal output at output conductor 58, but there will be no output signal at any of the output conductors 30, 32, 34 or 36 so that no false output will result. This type of false detection would then reset all circuits and start the decode sequence over again.

Typically as an additional check to insure that the proper frequency has been decoded, an output signal comparison circuit will be coupled to the output of the digital tone decoder to insure that the same frequency is sequentially decoded two times. This type of apparatus is well known in the art and will not be described here.

FIG. 3a shows a noise blanker circuit for the digital tone decoder which is constructed of digital logic circuitry. The noise blanker circuit 60 is interposed between limiter 10 and zero crossing counter 12.

In the digital tone decoder the frequency detection scheme depends upon measuring the time lapse from one zero axis crossing to the next.

FIG. 3b shows a graphical representation of the waveforms present in the circuit depicted in FIG. 3a without noise. In FIG. 3b "Input Signal A" represents the input sinusoidal waveform shown at location A in FIG. 3a. The waveform labelled "Limiter Out B" in FIG. 3b shows the square wave output of limiter 10. The waveform labelled "Transitional Pulse C" shows the pulsed signal generated by the first part of the noise limiter circuitry located between points B and C in FIG. 3a. A single transitional pulse is generated each time Input Signal A crosses the zero level.

FIG. 3c shows effects of having an input signal with noise. Waveforms B and C of FIG. 3c correspond to those shown in FIG. 3b and show the additional affects caused by the presence of noise. The waveform labelled "Noise Blanker Output D" shows the output of the noise blanker circit 60 of FIG. 3a at location D.

Figure 4:
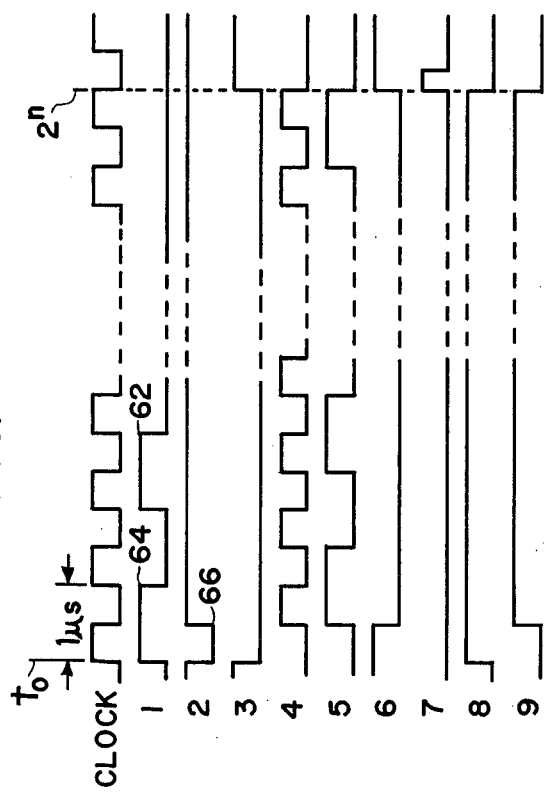
FIG. 4 is a timing diagram of the noise blanker circuit shown in FIG. 3.

FIG. 4 is a timing diagram showing the waveform of the clock signals from the one megahertz clock 20 and related waveforms produced by the portion of the noise blanker shown in FIG. 3a between locations C and D at points 1, 2, 3,...,9. Reference point 62 on waveform 62 on waveform number 1 of FIG. 4 corresponds to a pulse induced by noise. Waveform 2 which represents the output of the noise blanker circuit 60 shows that only the transition at reference number 64 on waveform 1 induces a change in state of waveform 2 as shown at reference point 66. The noise induced pulse 62 has no effect on the noise blanker output waveform 2.

As can be seen from FIG. 3b an input signal having no noise creates only a single transitional pulse per axis crossing. As shown by waveform C of FIG. 3c the addition of noise to the input signal produces multiple transitional pulses for each true zero crossing of the input sinusoidal wave. This is caused by multiple zero crossings due to the ragged shape of the noisy sinusoidal input signal. Without the presence of the noise blanker circuit 60 these multiple transitional pulses would lock up the decoder and disable its ability to decode valid signals. The noise blanker circuit 60 allows only the first transitional pulse to be transmitted to its output.

When the noise blanker circuit 60 receives this first transitional pulse an n-stage binary counter 68 is started and runs for a preset period of time. During this preset time interval any additional transitional pulses which might occur due to noise are blanked out. Since the noise present on the input signal is random, the mean distance between each transition pulse over any given period of time correlates to that of the input signal. This results in proper detection of the unknown incoming signal.

The blanking interval is determined by the length of the counter 68 which can be programmed digitally. The optimum blanking period corresponds to a quarter cycle of the highest expected signal frequency.

It will be apparent to those skilled in the art that the disclosed digital tone decoder may be modified in numerous ways and may assume many embodiments other than the preferred forms specifically set out and described above. For example, the width of the window covered by each data latch can be either widened or narrowed from that disclosed above. In addition, the number of different frequencies which the digital tone deoder can detect can be varied. Accordingly, it is intended by the appended claims to cover all such modifications of the invention which fall within the true spirit and scope of the invention.

What is claimed is:

1. A digital tone decoder comprising:
   a. means for generating a timing signal;
   b. zero crossing counter means for generating a decode signal after a predetermined number of zero crossings in response to an incoming time domain signal and for generating a reset signal at a predetermined time after the decode signal is sent to reset said zero crossing counter means to zero;
   c. decoder means coupled to said zero crossing counter and to said timing means for generating an output signal at one of a plurality of output terminals corresponding to the frequency of the incoming signal upon receipt of the decode signal from said zero crossing counter means, said decoder means being reset to an initial state upon receipt of the reset signal; and
   d. means for selectively modifying the number of zero crossings of said time domain signal appearing at the input to said zero crossing counter.

2. A digital tone decoder according to claim 1 wherein said decoder means further includes:
   a. binary counter means having a plurality of output terminal means responsive to said timing signal for sequentially generating an output signal at one of said plurality of output terminals as the count of said binary counter means increases and for resetting the contents of said binary counter means upon reaching a predetermined maximum count or upon receiving the reset signal from said zero crossing counter means.

3. A digital tone decoder according to claim 2 wherein said decoder means further includes:
   a. a plurality of logic circuit means each having a first and a second input terminal and an output terminal, said first and second input terminals being coupled to an adjacent pair of output terminals of said binary counter means, said first and second input terminals being responsive to said predeteremined output signals on said output terminals of said binary counter means for generating a digital output signal indicative of the frequency of said input signal.

4. A digital tone decoder according to claim 1 further including:
   a. limiter means coupled to said zero crossing counter means for receiving and limiting the incoming signal.

5. A digital tone decoder including a digital noise blanking circuit for converting a noisy time domain signal input signal into a series of transitional pulses comprising:
   a. means for generating a timing signal;
   b. first means for converting zero axis crossings of the noisy input signal into clusters of transitional pulses;
   c. second means for generating a single transitional pulse for each of the clusters of transitional pulses;
   d. zero crossing counter means for generating a decode signal after receiving a predetermined number of transitional pulses from said second means and for generating a reset signal at a predetermined time after the decode signal is sent to reset said zero crossing counter means to zero;
   e. decoder means coupled to said zero crossing counter and to said timing means for generating an output signal at one of a plurality of output terminals corresponding to the frequency of the incoming signal upon receipt of the decode signal from said zero crossing counter means, said decoder means being reset to an initial state upon receipt of the reset signal; and
   f. means for selectively modifying the number of zero crossings of said time domain signal appearing at the input to said zero crossing counter .

6. A digital tone decoder according to claim 5 wherein said decoder means further includes:
   a. binary counter means having a plurality of output terminal means responsive to said timing signal for sequentially generating an output signal at one of said plurality of output terminals as the count of said binary counter means increases and for resetting the contents of said binary counter means upon reaching a predetermined maximum count or upon receiving the reset signal from said zero crossing counter means.

7. A digital tone decoder according to claim 6 wherein said decoder means further includes:
   a. a plurality of logic circuit means each having a first and a second input terminal and an output terminal, said first and second input terminals being coupled to an adjacent pair of output terminals of said binary counter means, said first and second input terminals being responsive to said predetermined output signals on said output terminals of said binary counter means for generating a digital output signal indicative of the frequency of said input signal.

8. A digital tone decoder according to claim 5 further including:
   a. limiter means coupled to said digital noise blanking circuit for receiving and limiting the incoming signal.

9. A digital tone decoder according to claim 5 wherein said second means further includes:
   a. logic circuit means;

n-stage counter means coupled to said logic circuit means for generating a single transitional pulse in response to each cluster of transitional pulses.

10. A digital tone decoder according to claim 9 wherein:
 a. said logic circuit means includes a latch;
 b. said n-stage counter means includes means for selectively resetting said logic circuit means.

* * * * *